United States Patent
Goto et al.

(10) Patent No.: US 12,084,390 B2
(45) Date of Patent: Sep. 10, 2024

(54) MOLDED ARTICLE AND METHOD FOR PRODUCING SAME

(71) Applicant: DENKA COMPANY LIMITED, Tokyo (JP)

(72) Inventors: Daisuke Goto, Tokyo (JP); Hiroaki Ota, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 18/023,226

(22) PCT Filed: Feb. 16, 2022

(86) PCT No.: PCT/JP2022/006147
§ 371 (c)(1),
(2) Date: Feb. 24, 2023

(87) PCT Pub. No.: WO2022/181416
PCT Pub. Date: Sep. 1, 2022

(65) Prior Publication Data
US 2023/0303461 A1    Sep. 28, 2023

(30) Foreign Application Priority Data
Feb. 26, 2021   (JP) .................... 2021-029334

(51) Int. Cl.
*C04B 35/565*      (2006.01)
*B28B 5/02*        (2006.01)
(Continued)

(52) U.S. Cl.
CPC .......... *C04B 41/5155* (2013.01); *B28B 5/021* (2013.01); *B28B 11/12* (2013.01);
(Continued)

(58) Field of Classification Search
None
See application file for complete search history.

(56) References Cited

U.S. PATENT DOCUMENTS

2009/0075056 A1* 3/2009 Iwamoto ............... C22C 29/065
                                                              428/319.1
2009/0092793 A1    4/2009 Hirotsuru et al.
(Continued)

FOREIGN PATENT DOCUMENTS

CN        101361184 A      2/2009
CN        111992694 A  *  11/2020   ............. B22D 23/04
(Continued)

OTHER PUBLICATIONS

Machine translation of CN111995425A via EPO translated Nov. 14, 2023 (Year: 2020).*

(Continued)

*Primary Examiner* — Elizabeth Collister
(74) *Attorney, Agent, or Firm* — Oliff PLC

(57) ABSTRACT

A molded article having a small difference in thermal conductivities between a central section and a section located at an outer peripheral surface side; and a method for producing the same; wherein, a plate-shaped molded article includes an aluminum-silicon carbide composited section in which a metal including aluminum was impregnated into a silicon carbide porous body, wherein a difference in the densities, by Archimedes' principle, of a central section of the aluminum-silicon carbide composited section and of at least a portion of an outer side section located further toward the outside peripheral surface side than the central section is 3% or less.

10 Claims, 4 Drawing Sheets

(51) Int. Cl.
  *B28B 11/12* (2006.01)
  *C04B 35/622* (2006.01)
  *C04B 41/51* (2006.01)
  *C04B 41/88* (2006.01)

(52) U.S. Cl.
  CPC ...... *C04B 35/565* (2013.01); *C04B 35/62236* (2013.01); *C04B 41/88* (2013.01); *C04B 2235/3826* (2013.01); *C04B 2235/402* (2013.01); *C04B 2235/5224* (2013.01); *C04B 2235/602* (2013.01); *C04B 2235/616* (2013.01); *C04B 2235/96* (2013.01)

(56) References Cited

U.S. PATENT DOCUMENTS

| | | |
|---|---|---|
| 2009/0280351 A1 | 11/2009 | Hirotsuru et al. |
| 2017/0107158 A1 | 4/2017 | Goto et al. |
| 2017/0142859 A1 | 5/2017 | Miyakawa et al. |

FOREIGN PATENT DOCUMENTS

| | | | |
|---|---|---|---|
| CN | 111995425 A | * | 11/2020 |
| JP | S63-238968 A | | 10/1988 |
| JP | 2003-300788 A | | 10/2003 |
| JP | 2012-057252 A | | 3/2012 |
| JP | 2019-99850 A | | 6/2019 |
| JP | 2020-012194 A | | 1/2020 |
| WO | 2007/125878 A1 | | 11/2007 |
| WO | 2016/002943 A1 | | 1/2016 |

OTHER PUBLICATIONS

Machine translation of CN-111992694-A via the EPO. (translated Feb. 15, 2024) (Year: 2020).*
Apr. 12, 2022 Search Report issued in International Patent Application No. PCT/JP2022/006147.
Apr. 12, 2022 Written Opinion of the International Searching Authority issued in International Patent Application No. PCT/JP2022/006147.

* cited by examiner (a)

(b)

(a)

(b)

MOLDED ARTICLE AND METHOD FOR PRODUCING SAME

TECHNICAL FIELD

The present invention relates to a molded article and a method for producing the same.

BACKGROUND

Recently, aluminum-silicon carbide composites are used instead of conventional copper as heat-dissipating plates for power modules for use in electric vehicles and electric trains. Despite having lower thermal conductivity than copper, aluminum-silicon carbide composites have a thermal expansion coefficient of 6-8 ppm/K which is approximately half that of copper which is 17 ppm/K. Therefore, it is possible to suppress the occurrence of cracks at soldered layer sections where ceramic circuit substrates and heat-dissipating plates constituting the modules are joined, and high reliability can be realized.

Known methods for producing aluminum-silicon carbide composites include a method in which, after mixing additives, etc., in a silicon carbide powder, a molded article is formed by a dry press method, an extrusion method, an injection method, or the like, the molded article is baked to produce a porous molded article (preform) having silicon carbide as a main component, and thereafter, a metal containing aluminum is impregnated into the molded article by a non-pressurized impregnation method or by a pressurized impregnation method such as a forging cast method, a die casting method, or the like. Patent Documents 1 and 2, for example, disclose impregnating an aluminum-containing metal into a preform by a forging cast method.

CITATION LIST

Patent Literature

Patent Document 1: WO 2016/002943 A (pamphlet)
Patent Document 2: WO 2007/125878 A (pamphlet)

SUMMARY OF INVENTION

Technical Problem

A forging cast method is a method in which after arranging one or more plate-shaped preforms inside a mold, a molten aluminum-containing metal is poured into the mold and the aluminum-containing metal is impregnated into the preforms by pressurizing at a prescribed pressure for a prescribed time. At this time, if there are disparities in the amounts of aluminum-containing metal impregnated at a central section of a preform and a section located at an outer peripheral surface side thereof, then such disparities may cause differences in densities between a central section of the obtained aluminum-silicon carbide composite and a section located at an outer peripheral surface side thereof. A difference in densities between the central section and a section located at an outer peripheral surface side may cause a difference in thermal conductivity. Such cases may cause a reduction in reliability after modularization.

The present invention addresses a problem of providing: a molded article having a small difference in thermal conductivities between a central section and a section located at an outer peripheral surface side thereof; and a method for producing the same.

Solution to Problem

The present invention has the following embodiments.

(1) A plate-shaped molded article comprising an aluminum-silicon carbide composited section in which a metal comprising aluminum was impregnated into a silicon carbide porous body, wherein a difference in densities, by Archimedes' principle, between a central section of the aluminum-silicon carbide composited section and at least a portion of an outer side section thereof located further toward an outer peripheral surface side than the central section is 3% or less.

(2) The molded article according to claim 1, wherein the aluminum-silicon carbide composited section is configured so as to have a planar view quadrangular plate shape and, when the quadrangular plate shape is divided into 25 equally divided pieces by being cut, perpendicularly to the plate surface, along lines that are parallel to one side thereof and that divide the quadrangular plate shape into five equal parts, and along lines that are parallel to a side intersecting the one side and that divide the quadrangular plate shape into five equal parts, a difference between the density, by Archimedes' principle, of a divided piece at the center and an average value of the densities, by Archimedes' principle, of the divided pieces at the four corners is 3% or less.

(3) The molded article described in (1) or (2), further comprising an aluminum-inorganic fiber composited section comprising inorganic fibers and a metal comprising aluminum, wherein: the aluminum-inorganic fiber composited section constitutes at least a portion of the outer peripheral surface of the molded article; and in a field of view of 3 mm×4 mm when the outer peripheral surface comprising the aluminum-inorganic fiber composited section is observed with a microscope, the area of a region configured from the inorganic fibers is less than 1 mm².

(4) The molded article described in (3), wherein the aluminum-inorganic fiber composited section has one or more through-holes.

(5) The molded article described in any one of (1) to (4), wherein at least a portion of the plate surface and/or outer peripheral surface has a metal section.

(6) The molded article described in any one of (1) to (5), wherein the molded article is a heat-dissipating component.

(7) A method for producing the molded article described in any one of (1) to (6), wherein the method comprises the following steps:
  (i) preparing a plate-shaped silicon carbide porous body;
  (ii) holding the plate-shaped silicon carbide porous body at 600-750° C. for 50-200 minutes;
  (iii) arranging the silicon carbide porous body obtained in (ii) in a mold heated to 100-450° C.;
  (iv) pouring a molten metal containing aluminum into the mold; and
  (v) impregnating the metal containing aluminum into the plate-shaped silicon carbide porous body.

(8) The method described in (7), further comprising in step (i), preparing a plate-shaped silicon carbide porous body having at least one cut-out section in a peripheral edge section thereof, and arranging, in the cut-out section, an inorganic fiber molded article at 70-90 vol % with respect to the volume of the cut-out section, wherein in step (v), the metal containing aluminum is impregnated into the plate-shaped silicon carbide porous body and the inorganic fiber molded article.

Effects of Invention

According to the present invention, it is possible to provide: a molded article having a small difference in thermal conductivities between a central section and a section located at an outer peripheral surface side thereof; and a method for producing the same.

BRIEF DESCRIPTION OF DRAWINGS

FIG. 1(a) is a planar view and FIG. 1(b) is a cross-sectional view at line B-B.

FIG. 3(a) is a photograph of a region of the outer peripheral surface of the molded article that does not include inorganic fibers. FIG. 3(b) is a photograph of a region of the outer peripheral surface of the molded article that is configured from an aluminum-inorganic fiber composited section.

FIG. 4(a) is a photograph of a region of the outer peripheral surface of the molded article that does not include inorganic fibers. FIG. 4(b) is a photograph of a region of the outer peripheral surface of the molded article that is configured from an aluminum-inorganic fiber composited section.

DESCRIPTION OF EMBODIMENTS

Hereinafter, the present invention will be described in detail. The present invention is not limited to the following embodiments and can be implemented with changes added, as appropriate, as long as the effects of the invention are not hindered.

[Molded Article]

The molded article according to the present embodiment is a plate-shaped molded article comprising an aluminum-silicon carbide composited section comprising silicon carbide and a metal comprising aluminum, wherein a difference in densities, by Archimedes' principle, between a central section of the aluminum-silicon carbide composited section and at least a portion of an outer side section thereof located further toward an outside peripheral surface side than the central section (hereinafter also referred to as simply an "outer side section") is 3% or less. The difference in densities between the central section and the outer side section is 3% or less, and therefore, it is easy to obtain a molded article having a small difference in thermal conductivities between the central section and the outer side section.

The "plate-shaped molded article" is a molded article which is plate-shaped and has plate surfaces (also referred to "main surfaces" or "front and back surfaces") and surfaces extending in the thickness direction (also referred to as "outer peripheral surfaces" or "side surfaces"), and is preferably a flat plate-shaped molded article. The planar surface shape and thickness of the plate-shaped molded article and the size of the plate surface thereof will be described later.

Figure 1:
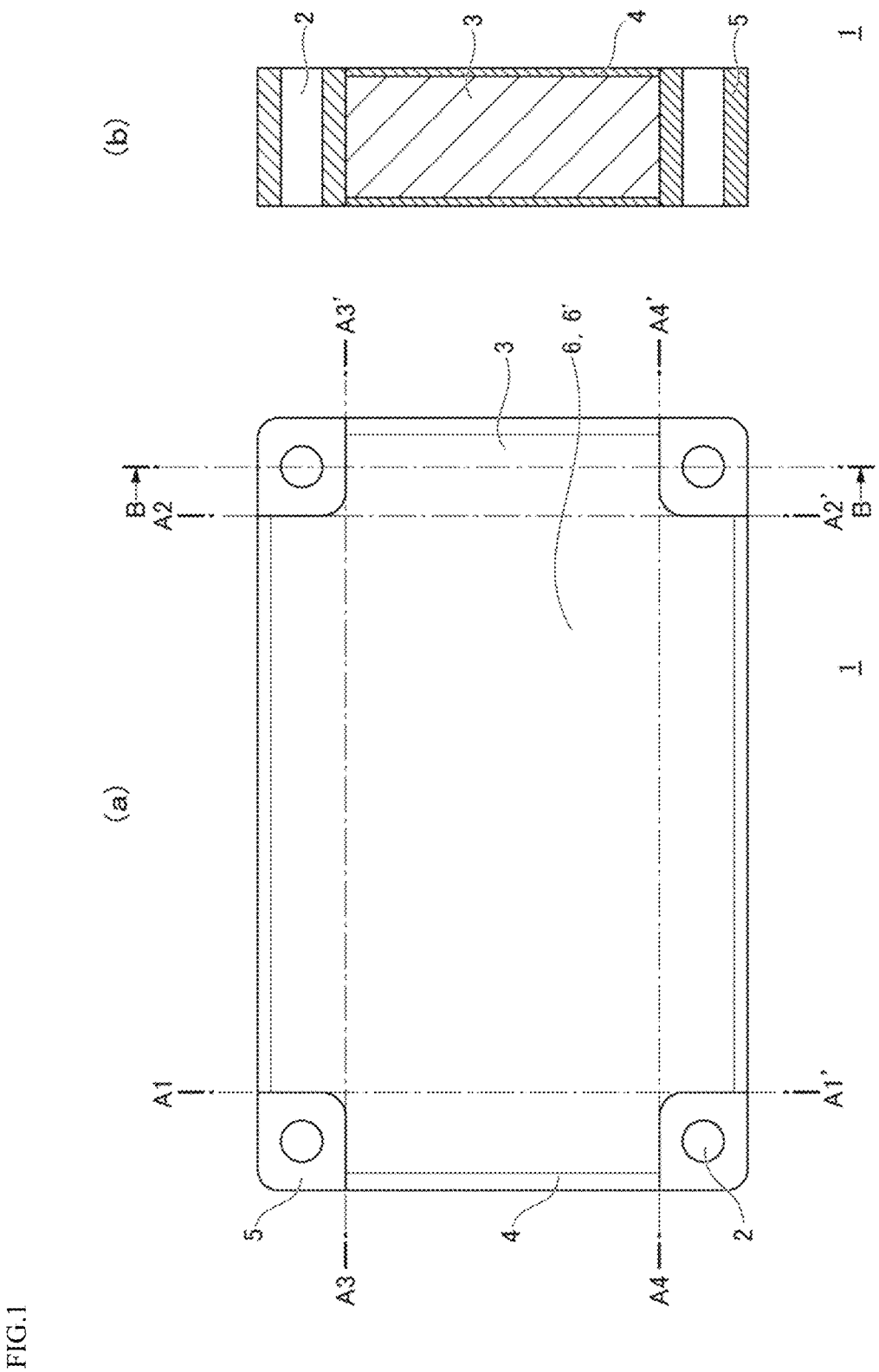
FIG. 1 illustrates a conceptual configuration of a molded article according to one embodiment.

FIG. 1 illustrates a conceptual configuration of a molded article according to one embodiment. A molded article 1 shown in FIGS. 1(a) and (b) is a flat plate-shaped molded article having a planar view oblong shape when seen from the plate surface direction, and has an aluminum-silicon carbide composited section 3. Aluminum-inorganic fiber composited sections 5 are provided at the four corners of the aluminum-silicon carbide composited section 3, and a metal section 4 is provided around the aluminum-silicon carbide composited section 3 (side surfaces and front and back surfaces) except for the corners. Through-holes 2 for screwing and fixing to another component are provided to the aluminum-inorganic fiber composited sections 5. The metal section 4 comprising aluminum, the aluminum-inorganic fiber composited section 5, and the through-holes 2 are to be provided as needed, and the molded article may also be configured so as to not include the metal section 4 comprising aluminum, the aluminum-inorganic fiber composited section 5, and/or the through-holes 2.

(Aluminum-Silicon Carbide Composited Section)

The aluminum-silicon carbide composited section is a region comprising silicon carbide and a metal comprising aluminum, and is configured from a composite of silicon carbide and a metal comprising aluminum. The aluminum-silicon carbide composited section has a structure in which the metal containing aluminum was impregnated into a silicon carbide porous body (preform). Methods for producing the silicon carbide porous body and the aluminum-silicon carbide composited section will be described later.

Examples of the metal containing aluminum include aluminum and aluminum alloys. In order to sufficiently penetrate voids of a preform during impregnation, it is preferable that the metal containing aluminum has as low a melting point as possible. Examples of such an aluminum alloy include aluminum alloys containing silicon at 5-25 mass %, preferably 7-20 mass %, and more preferably 10-15 mass %. Further containing magnesium, preferably at 0.1-3 mass % and more preferably at 0.5-1.5 mass %, is preferred since binding between silicon carbide particles and metal moieties becomes stronger. Other than aluminum, silicon, and magnesium, metal components, e.g., copper, etc., may be included in the aluminum alloy without particular limitations thereto as long as the effects of the present invention are not hindered.

The silicon carbide preferably comprises a silicon carbide porous body formed by molding and baking a silicon carbide powder. The size of the silicon carbide powder and methods for producing the silicon carbide porous body will be described later.

The relative density of the silicon carbide porous body in the aluminum-silicon carbide composited section is preferably 55-75%, more preferably 60-70%, and even more preferably 62-68%. By setting the relative density of the silicon carbide so as to be 55-75%, it is possible to set the thermal expansion coefficient of the molded article so as to be approximately 6-9 ppm/K. The relative density is a value calculated by calculating the density by dividing the weight measured by weighing scales by the volume calculated from the external dimensions measured by calipers and the thickness measured by a micrometer, and then dividing the calculated density by 3.21 g/cm$^3$ which is the density of silicon carbide.

The aluminum-silicon carbide composited section is plate-shaped and preferably flat plate-shaped. The planar surface shape of the aluminum-silicon carbide composited section can be rendered so as to be a shape that conforms to the planar surface shape of the molded article (for example, substantially quadrangular, substantially rectangular, etc.). In cases in which the molded article has an aluminum-inorganic fiber composited section or a metal section, which are described later, the shape thereof, including the aluminum-inorganic fiber composited section and the metal section, is to be rendered a shape that conforms to the planar surface shape of the molded article.

The average thickness of the aluminum-silicon carbide composited section is preferably 2-7 mm, more preferably 3-6 mm, and even more preferably 4-5 mm. The average thickness is a value determined by a laser displacement meter.

From the perspective of exhibiting a heat-dissipating action efficiently, the area of the plate surface of the aluminum-silicon carbide composited section with respect to the area of the plate surface of the molded article is preferably 70% or more and more preferably 85% or more. The area is calculated by using calipers to calculate the area of the silicon carbide porous body and the area of the molded article, and then dividing the area of the silicon carbide porous body by the area of the molded article.

The density, by Archimedes' principle, of the aluminum-silicon carbide composited section is preferably 2.92-3.08, more preferably 2.94-3.04, and even more preferably 2.96-3.02. By setting the density of the aluminum-silicon carbide composited section so as to be 2.92-3.08, it is possible to increase thermal conductivity, and it is also possible to set the thermal expansion coefficient so as to be the same value as that of a ceramic substrate on which the molded article is to be mounted, and thus, it is possible to suppress solder cracks which occur due to thermal expansion coefficient differences.

Herein, the density by Archimedes' principle, specifically, is measured by obtaining weights in air and in water by weighing scales.

For the aluminum-silicon carbide composited section, the difference between the density, by Archimedes' principle, of a central section and the density, by Archimedes' principle, of at least a portion of an outer side section located further toward the outer peripheral surface than the central section may be 3% or less, may be 2% or less, may be 1.5% or less, may be 1.0% or less, may be 0.8% or less, may be 0.5% or less, and may be 0.3% or less. The difference between the density of the central section and the density of the outer side section of the aluminum-silicon carbide composited section is 3% or less, and therefore, it is possible to make a difference in thermal conductivities between the central section and a section located on the outer peripheral surface side small.

With respect to a preference for the lower limit of the difference in densities, the smaller the difference is, the better, and the difference may be set so as to be, for example, 0.001% or more, 0.01% or more, 0.1% or more, or 0.2% or more.

The "central section" is a divided piece obtained by cutting away, perpendicularly to the thickness direction, a region in the vicinity of the center of the plate surface of the aluminum-silicon carbide composited section. A "region in the vicinity of the center" is, in the case of the planar surface shape of the aluminum-silicon carbide composited section being a quadrangular shape, a region including a point at which lines from opposing corners thereof intersect. Alternatively, when the aluminum-silicon carbide composited section is divided, perpendicularly to the plate surface, into nine equal parts, 25 equal parts, or 49 equal parts, the "region in the vicinity of the center" can be deemed to be the divided piece at the center. As a method for dividing the plate surface into equal parts, it is possible to divide the plate surface into equal parts by cutting along equally spaced lines parallel to one side of the plate surface and along equally spaced lines parallel to a side that intersects the one side. For example, by cutting perpendicularly along lines that divide one side of the plate surface into three parallel equal parts and also cutting perpendicularly along lines that divide a side that intersects the one side into three parallel equal parts, the plate surface can be divided into nine equal parts.

The "outer side section" is a divided piece obtained by cutting away, perpendicularly to the thickness direction, an arbitrary region located further toward the outer peripheral surface side than the central section. The "outer side section" is preferably the divided pieces of the four corners when the plate surface is divided perpendicularly into nine equal parts, 25 equal parts, or 49 equal parts. In order to be able to compare differences in density easily, the central section and the outer side section are preferably the same size (plate surface area×thickness).

Examples of a method for making the difference in densities between the central section and the outer side section 3% or less include impregnating a metal comprising aluminum evenly into the entirety of the silicon carbide porous body during production by a method using a non-pressurized impregnation method or a forging cast method. For example, it is possible to set the difference in densities between the central section and the outer side section so as to be 3% or less by holding at a temperature of 600-750° C. for 50-200 minutes when preheating the silicon carbide porous body during production of a molded article or by setting the mold temperature so as to be 100-450° C. The method for producing the molded article will be explained later.

In one embodiment, when the aluminum-silicon carbide composited section is divided, perpendicularly to the plate surface, into 25 equal parts, the difference between the density, by Archimedes' principle, of the divided piece at the center and the average value of the densities, by Archimedes' principle, of the divided pieces at the four corners preferably may be 3% or less, may be 2% or less, may be 1.5% or less, may be 1.0% or less, may be 0.8% or less, may be 0.5% or less, and may be 0.3% or less. By setting the difference between the density, by Archimedes' principle, of the divided piece at the center and the average value of the densities, by Archimedes' principle, of the divided pieces at the four corners so as to be 3% or less, it is possible to provide a molded article having a small difference in thermal conductivities between the central section and the outer side sections.

The "aluminum-silicon carbide composited section is divided, perpendicularly to the plate surface, into 25 equal parts" means that a region formed only by the aluminum-silicon carbide composited section is cut up perpendicularly so as to form 25 equal parts in a planar view from the plate surface direction. Depending on the planar surface shape of the aluminum-silicon carbide composited section, it may be difficult to divide the entirety of the aluminum-silicon carbide composited section into 25 equal parts. Therefore, preferably, a region having a shape, in a planar view, that is square or rectangular (preferably, a square or rectangular region in which the area of the plate surface is maximized) is clipped out from the silicon carbide composited section and divided into 25 equal parts. Further, in cases in which an aluminum-inorganic fiber composited section, which is described later, is provided to a peripheral edge section of the aluminum-silicon carbide composited section and in cases in which a metal section is provided to at least a portion of the plate surface and/or the outer peripheral surface of the aluminum-silicon carbide composited section, the aluminum-inorganic fiber composited section or the metal section is removed by a machining process before the aluminum-silicon carbide composited section is divided into 25 equal parts.

"25 equally divided parts" means cutting the plate surface up into 25 divided pieces by dividing one side of the plate surface into five parallel equal parts and also dividing a side that intersects the one side into five parallel equal parts. The method for cutting up the plate surface is performed by a publicly-known machining process. In order to be able to compare densities easily, it is preferable that the plate surface is divided into 25 equally divided parts by dividing one side of a preliminarily clipped out square or rectangular region thereof into five parallel equal parts and also dividing a side that intersects the one side into five parallel equal parts. In the case of being divided into 25 equal parts, all divided pieces have the same plate surface area. In order to be able to compare densities easily, the divided piece at the center and the divided pieces at the four corners preferably have the same thickness.

In one embodiment, the aluminum-silicon carbide composited section is configured so as to have a planar view quadrangular shape and, when the aluminum-silicon carbide composited section is divided into 25 equally divided pieces by cutting perpendicularly along lines that divide one side of the plate surface into five parallel equal parts and along lines that divide a side intersecting the one side into five parallel equal parts, a difference between the density, by Archimedes' principle, of the divided piece at the center and an average value of the densities, by Archimedes' principle, of the divided pieces at the four corners is 3% or less.

Figure 2:
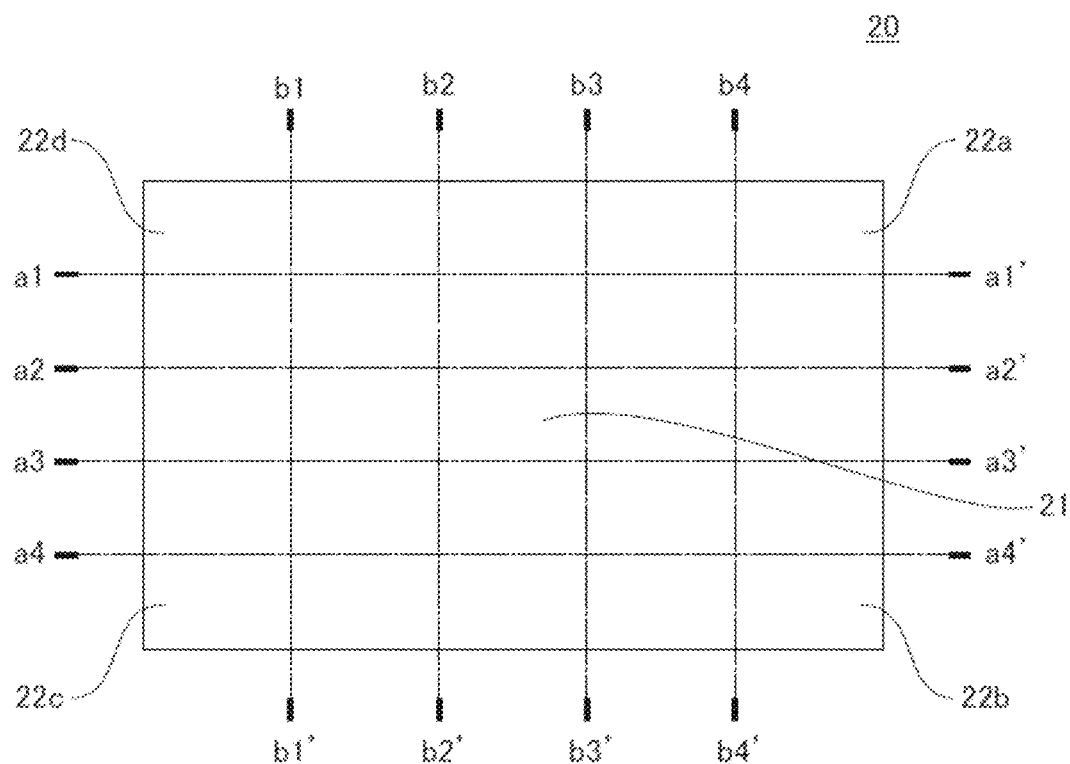
FIG. 2 is a schematic explanatory diagram regarding a method for determining a difference in densities.

FIG. 2 is a schematic explanatory diagram regarding a method for determining a difference in densities when an aluminum-silicon carbide composited section 20, which is plate-shaped and is rectangular in the planar view, is divided into 25 parts. The aluminum-silicon carbide composited section 20 is cut up into 25 divided pieces by being divided, along equally spaced cutting lines (line a1-a1', line a2-a2', line a3-a3', and line a4-a4') parallel to the short sides thereof, into five equal parts and also by being divided, along equally spaced cutting lines (line b1-b1', line b2-b2', line b3-b3', and line b4-b4') parallel to the long sides thereof, into five equal parts. Among the 25 divided pieces, the divided piece located at the center is denoted central section 21 and the divided sections at the four corners are denoted outer side sections 22a, 22b, 22c, and 22d (hereinafter also referred to as "22a-d"). The densities, by Archimedes' principle, of the divided piece at the center and the divided pieces 22a-d at the four corners are measured, an average value is calculated for the densities of the divided pieces 22a-d at the four corners, and the difference between the average density value and the density of the central section 21 is determined.

FIG. 1 illustrates a configuration of a molded article 1 in which an aluminum-inorganic fiber composited section 5 is provided to a peripheral edge section of an aluminum-silicon carbide composited section 3, and in which a metal section 4 is provided to at least a portion of the plate surface and/or the outer peripheral surface of the aluminum-silicon carbide composited section 3. In the case of having such a configuration, the aluminum-silicon carbide composited section 3 is divided into 25 parts after the aluminum-inorganic fiber composited section 5 and the metal section 4 are removed by a machining process to render the planar view thereof a quadrangular plate shape.

For example, when the molded article 1 of FIG. 1 further comprises, as needed, a metal section 4 provided to a plate surface and/or an outer peripheral surface of the aluminum-silicon carbide composited section 3, the metal section 4 is removed by a machining process, and a region 6 (clipped-out section 6) remaining after cutting at line A1-A1' and line A2-A2' which constitute boundaries between the aluminum-inorganic fiber composited section 5 and the aluminum-silicon carbide composited section 3 or a region 6' (clipped-out region 6') remaining after cutting at line A3-A3' and line A4-A4' which constitute the same is divided into 25 equal parts. Alternatively, in the molded article 1 of FIG. 1, a region remaining after cutting at line A1-A1' and line A2-A2' and also cutting at line A3-A3' and line A4-A4' is divided into 25 equal parts in the same manner as that shown in FIG. 2.

In that case, among the 25 divided pieces, the divided piece 21 at the center corresponds to the "central section" and the divided pieces 22a, 22b, 22c, 22d at the four corners correspond to the "outer side sections".

Aluminum-Inorganic Fiber Composited Section

In one embodiment, the molded article has, at a peripheral edge section, at least one aluminum-inorganic fiber composited section. The aluminum-inorganic fiber composited section is a region comprising inorganic fibers and a metal comprising aluminum, and has a structure in which inorganic fibers are included (dispersed) in a metal layer comprising aluminum. The aluminum-inorganic fiber composited section has high toughness compared to the aluminum-silicon carbide composited section and the metal section, which is described later, and thus, cracks and breakages do not readily occur in this section. Due thereto, the aluminum-inorganic fiber composited section has, in cases in which through-holes for screwing and fixing the molded article to another component are formed therein, an action of preventing the occurrence of cracks and breakages at the through-holes and the vicinity thereof.

The flat plate-shaped molded article 1 illustrated in FIG. 1 has aluminum-inorganic fiber composited sections 5 at the four corners. One through-hole 2 is provided in each of the aluminum-inorganic fiber composited sections 5 at the four corners. The molded article 1 has aluminum-inorganic fiber composited sections 5 at the four corners but may have an aluminum-inorganic fiber composited section 5 at another section of the peripheral edge section (for example, a section between corner sections of the molded article, etc.) in accordance with locations at which the through-holes 2 are to be formed.

From the perspective of production being easy, the metal containing aluminum is preferably the same metal comprising aluminum used when producing the aluminum-inorganic fiber composited section described above.

Examples of the inorganic fibers include metals, metal oxides, glass, and carbon, etc., and thereamong, metal oxides are preferable, with alumina fibers being particularly preferable.

From the perspective of increasing plating properties when a plating process is carried out on the molded article, the content of the inorganic fibers is preferably an amount such that the inorganic fibers are not exposed from a surface of the molded article. For example, the content of the inorganic fibers is, with respect to the volume of the aluminum-inorganic fiber composited section, preferably 25 vol % or less and more preferably 1-25 vol %.

In one embodiment, the aluminum-inorganic fiber composited section constitutes at least a portion of the outer peripheral surface of the molded article, and an area, measured by binarization processing of a region configured from the inorganic fibers in a field of view of 3 mm×4 mm when the outer peripheral surface including the aluminum-inorganic fiber composited section is observed with a microscope from a direction perpendicular to the outer peripheral surface, is less than 1 mm², preferably less than 0.8 mm², and more preferably less than 0.5 mm². By configuring the area of a region configured from the inorganic fibers so as to be less than 1 mm², it is possible to increase plating adhesion when a plating layer is to be provided to the molded article. The lower limit is not particularly limited and may be 0.001 mm² or more, may be 0.005 mm² or more, may be 0.01 mm² or more, may be 0.05 mm² or more, and may be 0.1 mm² or more. The binarization processing may be performed by using image processing software. Note that a threshold value of the binarization processing is to be set such that a section corresponding to the inorganic fibers can be appropriately distinguished from another section. For example, in the case of an image having brightness such as that shown in FIGS. 3 and 4, the threshold value is set to 120.

The "outer peripheral surface" means a surface (side surface) which extends in the thickness direction of the plate-shaped molded article and surrounds the periphery of the plate surface. The molded article 1 of FIG. 1 is planar view rectangular when seen from the plate surface direction and has an outer peripheral surface going around the periphery of the front and back plate surfaces. The outer peripheral surface of the molded article 1, when seen from a direction perpendicular to the outer peripheral surface, has a structure in which the aluminum-inorganic fiber composited section 5 forms a portion of the outer peripheral surface.

A "region configured from the inorganic fibers" means a region in which the same components as the inorganic fibers are detected by using a scanning electron microscope (for example, SU6600 manufactured by Hitachi High-Tech Corporation) and an EDX (for example, EMAX manufactured by HORIBA, Ltd.). The "region configured from the inorganic fibers" is normally observed as a black spot in a microscope photograph.

Metal Section

In one embodiment, the molded article has a metal section in at least a portion of the plate surface and/or the outer peripheral surface. The metal section preferably comprises a metal comprising aluminum. By having a metal section, it is possible to easily carry out plating, and by carrying out plating, solder leak properties improve and when used as a base plate for a power module, the molded article can easily be joined to a ceramic circuit substrate by soldering.

From the perspective of production being easy, the material of the metal section is preferably the same as the metal comprising aluminum used when producing the aluminum-inorganic fiber composited section described above. In that case, examples of a method for forming the metal section include a method of forming the metal section by making, when producing the aluminum-silicon carbide composited section, a cut-out in the silicon carbide porous body in advance at a location at which the metal section is to be formed.

The molded article 1 of FIG. 1 has a metal section 4 in the plate surface and a portion of the side surfaces of the aluminum-silicon carbide composited section 3. However, a portion of the metal section 4 may be removed by a machining process, or the like, to expose at least a portion of the aluminum-silicon carbide composited section 3.

From the perspective of further increasing plating adhesion when a plating process is carried out on the molded article, the average thickness of the metal section in the plate surface direction thereof is preferably 10-150 μm and more preferably 30-100 μm. The thickness of the metal section may also be adjusted to a prescribed thickness by carrying out a grinding process on the molded article. The average thickness of the metal section is a value determined by a method described in FIG. 3 of JP 6595740 B. That is, the aluminum-inorganic fiber composited section is cut with a diamond cutting tool along straight lines passing to the inside of 20% of the molded article total length from an edge section of the molded article, and along center lines of the molded article. Then, the surface section is observed at the locations shown by circles in FIG. 3 of JP 6595740 B with a scanning electron microscope at a magnification of 100×. The distance from the outermost surface to the silicon carbide particles is measured at five locations at intervals of 200 μm and the average of the five points is calculated to obtain an average thickness of the metal section.

From the perspective of sufficiently covering the silicon carbide and enabling plating to be deposited on the outer peripheral surface, the average thickness of the metal section in the outer peripheral surface direction thereof is preferably 0.1-2 mm and more preferably 0.5-1.5 mm.

Through-Holes

The molded article may have provided thereto one or more through-holes for screwing and fixing the molded article to another component. In order to prevent the occurrence of cracks and breakages in the through-holes and the vicinity thereof, it is preferable for the through-holes to be provided to the aluminum-inorganic fiber composited section.

The molded article 1 of FIG. 1 has one through-hole provided to each aluminum-inorganic fiber composited section at the four corners. However, taking into account the configuration of another component to which the molded article is to be attached and properties of materials constituting the molded article, the through-holes may be provided at any location on the molded article.

Plating Layer

The molded article may have a plating layer on the plate surface and/or the outer peripheral surface. By having a plating layer, the molded article can easily be joined to a ceramic circuit board by soldering when the molded article is to be used as a base plate for a power module.

The plating layer is preferably an Ni plating layer. The method for carrying out the plating process is not particularly limited and may be either an electroless plating process or an electroplating process performed after a surface treatment or polishing is carried out, as required.

The thickness of the plating layer is preferably 1-20 μm and more preferably 3-12 μm. By setting the thickness of the plating layer so as to be 1-20 μm, it is possible to prevent a reduction in heat-dissipating properties caused by pinholes being generated in some portions thereof. It is also possible to prevent peeling of the plating due to a thermal expansion difference between an Ni plating layer and an aluminum alloy.

Molded Article

The molded article is plate-shaped and preferably flat plate-shaped. The planar surface shape of the molded article can be selected in accordance with a use thereof and is preferably a substantially quadrangular shape when used as a heat-dissipating plate. "Substantially" means that quadrangular shapes having rounded corners are included. Examples of quadrangular shapes include squares, rectangles (oblongs), parallelograms, and rhombuses, etc. Being a square or a rectangle is more preferable, and being a rectangle is even more preferable. The thickness and the size of the plate surface will be described later. "Planar view" means a planar view from a main surface direction (plate surface direction).

The average thickness of the molded article is preferably 2 mm-7 mm and more preferably 3 mm-5 mm. The average thickness is a value determined by a laser displacement meter.

The size of the plate surface of the molded article is not particularly limited and, for example, in the case of being a planar view rectangle, the size is a rectangle having short sides of 80-150 mm and long sides of 130-270 mm. The molded article according to the present embodiment has a small difference in densities between the central section and a section located at an outer peripheral surface side. Therefore, even when dimensions are large, it is possible to obtain a molded article having a small difference in thermal conductivities between the central section and a section located at the outer peripheral surface side. For example, it is possible to configure a planar view rectangular molded article having short sides of 130-150 mm and long sides of 140-270 mm.

The central section and the outer side section of the molded article preferably have a thermal conductivity at 25° C. of 180 W/mK or more, more preferably 190 W/mK or more, and even more preferably 200 W/mK or more. The thermal expansion coefficient at 150° C. is preferably $9 \times 10^{-6}$/K or less and more preferably $8 \times 10^{-6}$/K or less. The thermal conductivity is a value measured by the laser flash method at 25° C. The thermal expansion coefficient is a value measured by a thermal expansion meter from 50° C. to 150° C.

In the molded article, the difference between the thermal conductivity at 25° C. of the central section and the thermal conductivity at 25° C. of an outer side section located further toward the outer peripheral surface side than the central section is preferably 10% or less, more preferably 8% or less, and even more preferably 7% or less. Because of the small difference in thermal conductivities between the central section and the outer side section, it is possible to dissipate heat uniformly from the entirety of the molded article. The method for specifying the central section and the outer side section is the same as the method for specifying the central section and the outer side section of the aluminum-silicon carbide composited section described above. Respective test pieces are clipped out from the central section and the outer side section, the heat conductivities thereof are measured, and the difference therebetween is calculated.

In a molded article in one embodiment, among divided pieces obtained by making 25 equal divisions perpendicularly to the plate surface, the difference between the thermal conductivity at 25° C. of the divided piece at the center and the average value of the thermal conductivity at 25° C. of the divided pieces at the four corners is preferably 10% or less, more preferably 8% or less, and even more preferably 7% or less. By setting the difference between the thermal conductivity at 25° C. of the divided piece at the center and the average value of the thermal conductivity at 25° C. of the divided pieces at the four corners so as to be 10% or less, it is possible to dissipate heat uniformly from the entirety of the molded article.

The method for achieving 25 equally divided parts is the same as the method for dividing the aluminum-silicon carbide composited section into 25 equal parts described above. The thermal conductivity of the divided piece at the center and the thermal conductivity of each of the divided pieces at the four corners are measured, an average value of the thermal conductivity is calculated for the divided pieces at the four corners, and the difference between the thermal conductivity of the divided piece at the corner and the calculated average value of the divided pieces at the four corners is calculated.

Methods for setting the difference in thermal conductivities so as to be 10% or less include a method of holding at a temperature of 600-750° C. for 50-200 minutes when preheating the silicon carbide porous body during production of the molded article.

The molded article can be used as a component for dissipating heat generated from electronic/electrical components, that is, as a heat-dissipating component. When used as a heat-dissipating component, the molded article preferably has a plating layer on a surface thereof. In an intermediate step of such an electronic/electrical component, the molded article may further go through steps such as having an insulating substrate or chip joined thereto, being attached to a case, resin-filling, or the like, to be rendered as a module.

[Production Method]

The method for producing the molded article comprises the following steps:
(i) preparing a plate-shaped silicon carbide porous body;
(ii) holding the plate-shaped silicon carbide porous body at 600-750° C. for 50-200 minutes;
(iii) arranging the silicon carbide porous body obtained in (ii) in a mold heated to 100-450° C.;
(iv) pouring a molten metal containing aluminum into the mold; and
(v) impregnating the metal containing aluminum into the plate-shaped silicon carbide porous body.

(Step (i))

In step (i), a plate-shaped silicon carbide porous body (preform) is prepared. When producing a preform, the preform can be prepared by molding and baking a silicon carbide powder. The molding may be carried out by a publicly-known dry press method, wet press method, extrusion method, injection method, casting method, or a method of punching out after sheet-molding, etc.

From the perspective of improved density of the molded article, a silicon carbide powder with an average particle size of preferably 1-250 μm and more preferably 5-200 μm is preferable as the silicon carbide powder. Granularity may also be adjusted by blending a plurality of silicon carbide powders having different particle sizes. The "average particle size" is a value obtained by calculating an average value of diameters determined for 1000 particles by using a scanning electron microscope (for example, "JSM-T 200" manufactured by JEOL Ltd.) and an image analyzing apparatus (manufactured by Nippon Avionics Co., Ltd., for example).

It is possible to add to the silicon carbide, as required, a binding material such as silica, etc., or an inorganic or organic binder in order to exhibit a strength which prevents the occurrence of abnormalities such as breakages during impregnation of the metal. A silica sol is preferable as the binder since a high-strength preform is then easily obtained. From the perspective of improved relative density, the binder is preferably added at a ratio of at most 20:100, in terms of volume ratio, as a solid content with respect to the silicon carbide.

In one embodiment, the silicon carbide porous body is molded by a wet press method. The wet press method involves preparing porous concave and convex molds, filling the concave mold with a silicon carbide powder and a slurry having an inorganic binder and water as main components, and compression molding using the convex mold.

Although differing depending on the production method, the silicon carbide porous bodies molded by the method described above normally undergo drying and heating/degreasing treatments and are then baked so as to have a prescribed strength.

As baking conditions, baking is preferably performed in an inert atmosphere or in air at a temperature of 700° C. or more. However, in the case of air, when baked at a temperature of 1100° C. or more, the silicon carbide is oxidized and the resulting composite has a reduced thermal conductivity, and therefore, it is preferable to at least perform baking at this temperature or less.

In order to set the relative density of the molded article so as to be 55-75%, it is preferable to blend silicon carbide powders having different granularities. One example of the silicon carbide is to use a mixture of a powder having an average particle diameter of 100 μm and a powder with an average particle diameter of 10 μm or less, or a mixture of a powder having an average particle diameter of 60 μm and a powder having an average particle diameter of 10 μm or less. The average particle diameter can be measured by calculating an average value of diameters determined for 1000 particles using a scanning electron microscope (for example, "JSM-T 200" manufactured by JEOL Ltd.) and an image analyzing apparatus (manufactured by Nippon Avionics Co., Ltd., for example).

In one embodiment, step (i) comprises preparing a plate-shaped silicon carbide porous body having at least one cut-out section in a peripheral edge section. A "peripheral edge section" means a region including an edge portion of the plate-shaped silicon carbide porous body.

For example, if the molded article has aluminum-inorganic fiber composited sections in the four corners as illustrated in FIG. 1, then a silicon carbide porous body shaped such that cut-out sections are formed in the four corners of the obtained silicon carbide porous body is prepared. Forming of the cut-out sections is preferably carried out at the time of compression molding by using a formwork, or the like, having a shape of the desired cut-out section. Further, the cut-out sections can also be formed by carrying out a machining process on the plate-shaped molded article.

It is preferable to arrange an inorganic fiber molded article in the cut-out section so as to be preferably 70-95 vol %, more preferably 75-92 vol %, and even more preferably 70-90 vol % or 80-90 vol % with respect to the volume of the cut-out section. By arranging the inorganic fiber molded article in the cut-out section at a ratio of 70-95 vol %, even when through-holes are provided in the molded article, it is possible to prevent the occurrence of cracks and breakages in the through-holes and the vicinity thereof. In addition, with such an arrangement, inorganic fibers are not readily exposed at the outer peripheral surface of the molded article, and thus, it is also possible to increase plating adhesion when a plating process is carried out.

The "volume of the cut-out section" means the volume (plate surface area×thickness) of a portion corresponding to the cut-out section in a shape the same as that of the obtained molded article, and is normally a region surrounded by the outer peripheral surface of the molded article and the outer peripheral surface of the silicon carbide porous body.

Examples of the inorganic fiber molded article include an inorganic fiber molded article obtained by molding using an organic binder or an inorganic binder, etc. More specifically, it is also possible to use a compression-molded felt-type inorganic fiber molded article. The materials of the inorganic fibers are the same as those described for the aluminum-inorganic fiber composited section above, and therefore, shall be omitted here.

When using an inorganic fiber molded article, the content of inorganic fibers in the inorganic fiber molded article is preferably 25 vol % or less and more preferably 1-25 vol %. By setting the content of the inorganic fibers in the inorganic fiber molded article so as to be 25 vol % or less, the content ratio of the inorganic fibers in the aluminum-inorganic fiber molded article can easily be adjusted.

In one embodiment, it is possible to stack two or more silicon carbide porous bodies so as to be configured as one block. By stacking two or more silicon carbide porous bodies so as to be configured as one block, it is possible to increase production efficiency.

The silicon carbide porous bodies are sandwiched with mold release plates coated with a mold release agent and stacked so as to be configured as one block. When stacking the silicon carbide porous bodies so as to be configured as one block, stacking is carried out by sandwiching with mold release plates such that the surface direction tightening torque is 1-20 Nm and preferably 2-10 Nm. The stacking method is not particularly limited and examples thereof include a method in which the silicon carbide porous bodies are stacked by being sandwiched with mold release plates which are made of stainless steel and coated with a mold release agent, and then arranging, at both sides, plates made of iron, coupling with bolts, and tightening at a prescribed tightening torque to obtain one block. With respect to an appropriate surface direction tightening torque, although differing depending on the strength of the silicon carbide porous bodies that are used, at a tightening torque of less than 1 Nm, the thickness of the surface aluminum layer of the obtained aluminum-silicon carbide composite may become thick and there may be cases wherein differences in thickness are too large. Meanwhile, if the tightening torque exceeds 20 Nm, there may occur problems wherein the surface aluminum layer of the obtained aluminum-silicon carbide composite becomes too thin locally, the aluminum-silicon composite is partially exposed during a subsequent surface treatment such as a plating pretreatment, or the like, and plating is not deposited at that portion or plating adhesion decreases, etc.

(Step (ii))

In order to sufficiently impregnate the metal comprising aluminum into the silicon carbide porous body, the silicon carbide porous body is preheated at a predetermined temperature. Patent Document 1 discloses heating to 550° C. or more in order to prevent a molten metal containing aluminum from solidifying while insufficiently impregnated. The present inventors discovered that by adjusting the holding time during preheating and setting the temperature of the mold during impregnation so as to be a prescribed range, it is possible to further reduce the difference in densities between the central section and the outer side section and it is also possible to reduce the difference in thermal conductivities.

In step (ii), the silicon carbide porous body (and inorganic fibers, as required) prepared in (i) is held at 600-750° C., preferably more than 650° C. and 750° C. or less, and more preferably 660-740° C. for 50-200 minutes, preferably 80-150 minutes, and more preferably 100-120 minutes. By holding the silicon carbide porous body at 600-750° C. for 50-200 minutes, it is possible to obtain a molded article having a small difference in densities between the central section and an outer side section located on the outer peripheral surface side and having a small difference in thermal conductivities therebetween. If the holding time exceeds 200 minutes, even if within the range of the preheating temperature described above, the difference in thermal conductivities between the central section and the outer side section located on the outer peripheral surface side may become large.

(Step (iii))

In step (iii), the silicon carbide porous body (and inorganic fibers, as required) obtained in (ii) is arranged in a mold heated at 100-450° C., preferably 150-350° C., more preferably 150-330° C., and even more preferably 200-300° C. It has conventionally been thought that it is preferable for the mold temperature to be as high as possible so that the temperature of the preheated silicon carbide porous body does not decrease. However, in the production method according to the present embodiment, it was discovered that, on the contrary, with respect to the silicon carbide porous body that underwent preheating in step (ii), by setting the mold temperature to 100-450° C. and quickly solidifying the metal comprising aluminum, it is possible to obtain a molded article having a small difference in densities between a central section and a section located on the outer peripheral surface side and having a small difference in thermal conductivities therebetween.

The mold is preferably a press-type mold so that the metal comprising aluminum can then be impregnated by a forging cast method in step (iv).

When two or more silicon carbide porous bodies are stacked and steps (iii) and (iv) are carried out simultaneously, the mold preferably has a concave mold (die) having a depth or width corresponding to the number of silicon carbide porous bodies to be stacked.

Conventionally, forging cast methods have involved fixing the outer peripheral surface of a silicon carbide porous body, so as to be surrounded, with an iron frame, arranging in a mold by stacking this in a plurality of layers, and pouring a molten metal comprising aluminum into the mold in order to form a product shape. In such a method, the outer peripheral surface of each silicon carbide porous body is covered by the iron frame, and the iron frames of the silicon carbide porous bodies are stacked, with no gaps, in the surface direction. Therefore, the molten metal comprising aluminum is only able to flow in from the outermost-located silicon carbide porous body side. As a result thereof, differences in densities between the central section and sections located at the outer peripheral surface side occur easily. For this reason, it is preferable not to use iron frames for forming a product shape which surround the outer peripheral surface of the silicon carbide porous body.

The silicon carbide porous body is arranged in the mold by being set in a press concave mold (die).

(Step (iv))

In step (iv), the molten metal containing aluminum is poured into the mold in which the silicon carbide porous body (and inorganic fibers, as required) is arranged. The kind of metal containing aluminum is as described above.

The temperature of the molten metal comprising aluminum is preferably 700-850° C. and more preferably 780-810° C. By setting the temperature of the molten metal comprising aluminum so as to be 700-850° C., it is possible to obtain a molded article having a small difference in thermal conductivities between a central section and a section located at an outer peripheral surface side thereof.

(Step (v))

In step (v), the metal containing aluminum is impregnated into the plate-shaped silicon carbide porous body (and inorganic fibers, as required). When the molded article has at least one cut-out section in the peripheral edge section, the metal containing aluminum is impregnated into the plate-shaped silicon carbide porous body and the inorganic fiber molded article.

Impregnation is carried out by pouring in the metal containing aluminum in step (iv) and then sealing the press-type concave mold (die) with an upper punch and compressing.

The pressure during impregnation is preferably 30-100 MPa, more preferably 40-90 MPa, and even more preferably 50-80 MPa. Impregnation time is preferably 5-30 minutes, more preferably 10-25 minutes, and even more preferably 15-20 minutes.

By setting the pressure during impregnation and the time of the same so as to be, respectively, 30-100 MPa and 5-30 minutes, it is possible to obtain a molded article having a small difference in densities between a central section and a section located at an outer peripheral surface side and having a small difference in thermal conductivities therebetween.

In step (iv), when the size of the mold is larger than the size of the silicon carbide porous body, a metal section having the same composition as the metal comprising aluminum that is impregnated into the silicon carbide porous body is formed on at least a portion of the plate surface and/or the outer peripheral surface of the silicon carbide porous body.

The molded article can be obtained by cooling to room temperature and then removing from the mold.

By cooling an ingot after impregnation to room temperature and thereafter cutting with a wet band saw, or the like, it is possible to obtain an aluminum-silicon carbide composite.

Thereafter, it is possible to process to a prescribed size by drilling away unnecessary metal sections in a machining center, as required (Other Steps)

In addition to steps (i)-(v) described above, the method for producing the molded article may also comprise other steps. For example, when the molded article has a plating layer, it is possible to perform a surface treatment or a polishing treatment, as required, on the molded article obtained in step (v), and then carry out a plating process, preferably an Ni plating process. The method for carrying out the plating process is not particularly limited, and may be either an electroless plating process or an electroplating process performed after a surface treatment or polishing is carried out, as required.

Further, after step (v), there may be a step of clipping the molded article so as to become a required product shape. Clipping can be performed by a publicly-known machining process such as using a wet band saw, or the like. However, if a plating process is to be performed thereafter, from the perspective of increasing plating adhesion, the molded article is clipped in a range wherein inorganic fibers are not exposed at the outer peripheral surface of the molded article.

EXAMPLES

The present invention shall be explained in more detail by referring to the examples below, but interpretation of the present invention is not to be limited by these examples.

Example 1

A silicon carbide powder A (NG-150, average particle diameter: 100 µm; manufactured by Pacific Rundum Co., Ltd.), a silicon carbide powder B (GC-1000 F, average particle diameter: 10 μm; manufactured by Yakushima Denko Co., Ltd.), and a silica sol (Snowtex; manufactured by Nissan Chemical Corporation) were blended at a mass ratio of 60:40:10 and mixed for one hour with a stirring mixer.

This mixed powder was molded, at a pressure of 10 MPa, into a shape of 120 mm×70 mm×7 mm having a cut-out section at the four corners. The four corners at the corner sections of this molded article have a cut-out section of 15 mm×15 mm. This molded article was dried for two hours at a temperature of 120° C. and then heated for two hours at 960° C. in air to produce a silicon carbide porous body. Note that the obtained silicon carbide porous body was processed to a shape of 20 mm in diameter×7 mm, and the relative density, as calculated from the dimensions and mass thereof, was 65%. A total of 48 silicon carbide porous bodies were produced by the same method as that described above.

Next, the obtained silicon carbide porous bodies were each processed to a thickness of 4.8 mm with a diamond processing tool. Twelve specimens were stacked with a 0.8 mm thick SUS plate coated with a mold release agent sandwiched between specimens, and furthermore, outer side surfaces of the specimens located at the two ends were sandwiched with 6 mm thick iron plates and fixed with 10 mm diameter bolts and nuts to form one block. A total of four blocks were formed by the same method.

The cut-out sections at the corner sections of each silicon carbide porous body were filled with an inorganic fiber molded article ("Alcen", manufactured by Denka Co., Ltd.) having a size of 10 mm×10 mm×4.8 mm in thickness. The content of the inorganic fiber molded article was 90 vol % with respect to the volume of the cut-out section.

Next, four of the blocks described above were arranged in an electric furnace as one block. The silicon carbide porous bodies were preheated by being held at a temperature of 600° C. for 120 minutes.

Next, the silicon carbide porous bodies were arranged inside press molds having a cavity with inner dimensions of 320 mm×260 mm×440 mm and which had been heated to 250° C. in advance.

A molten aluminum alloy (containing 12 mass % silicon and 0.9 mass % magnesium) that had been heated to a temperature of 810° C. was poured into the press molds. The press molds were sealed and then pressed at a pressure of 60 MPa for 15 minutes to impregnate the aluminum metal into the silicon carbide porous body and inorganic fibers (aluminum short fibers).

After cooling to room temperature, mold-sized blocks were cooled to room temperature and then cut with a wet band saw, or the like, to obtain an aluminum-silicon carbide composite. Next, the obtained aluminum-silicon carbide composites were subjected to outer periphery processing and drilling in a machine center to obtain aluminum-silicon carbide composites (molded articles) which were substantially rectangular in the planar view and were of a prescribed size (122 mm×72 mm×5 mm).

Example 2

Other than setting the preheating temperature to 650° C., a molded article was obtained by the same method as in Example 1.

Comparative Examples 1-4

Other than setting the preheating temperature conditions and the mold temperature to those shown in Table 1, molded articles were obtained by the same method as in Example 1.

(Density)

The short sides of the molded articles obtained in the examples and comparative examples were cut, using a diamond cutter, at the boundaries (line A1-A1', line A2-A2', line A3-A3', and line A4-A4' in FIG. 1) between the aluminum-silicon carbide composited section and the aluminum-inorganic fiber composited section, and the aluminum-inorganic fiber composited section was removed. The remaining aluminum-silicon carbide composited section was cut into 25 equal parts by being divided into five equal parts along equally spaced cutting lines parallel to the short sides thereof and also by being divided into five equal parts along equally spaced cutting lines parallel to the long sides thereof. Thereamong, the densities of the divided piece located at the center and the divided pieces located at the four corners were determined by Archimedes' principle by using weighing scales ("AUW120", manufactured by Shimadzu Corporation) to measure the weights in air and in water.

An average value of the densities of the divided pieces located at the four corners was calculated and the difference between the average value and the density of the central section was determined. The results are shown in Table 1.

(Thermal Conductivity)

The molded articles obtained in the examples and comparative examples were cut up into 25 divided pieces by the same method used when measuring the density. Thermal conductivity measurement test pieces (11 mm in diameter, 1 mm in thickness) were produced from these divided pieces. Using respective test pieces, the thermal expansion coefficient at a temperature of 150° C. was measured with a thermal expansion meter (TMA300, manufactured by Seiko Instruments Inc.) and the thermal conductivity at 25° C. was measured by a laser flash method (LF/TCM-8510B, manufactured by Rigaku Corporation). The results are shown in Table 1.

(Observation of Outer Peripheral Surface)

The outer peripheral surfaces of the molded articles obtained in Examples 1 and 2 were observed with a microscope (VHX-2000, manufactured by Keyence Corporation). A field of view of 3 mm×4 mm was observed for a region not including inorganic fibers and a region configured from the aluminum-inorganic fiber composited section, binarized with image processing software, and the area of a region detected as a black color (region configured from inorganic fibers) was measured.

Figure 3:
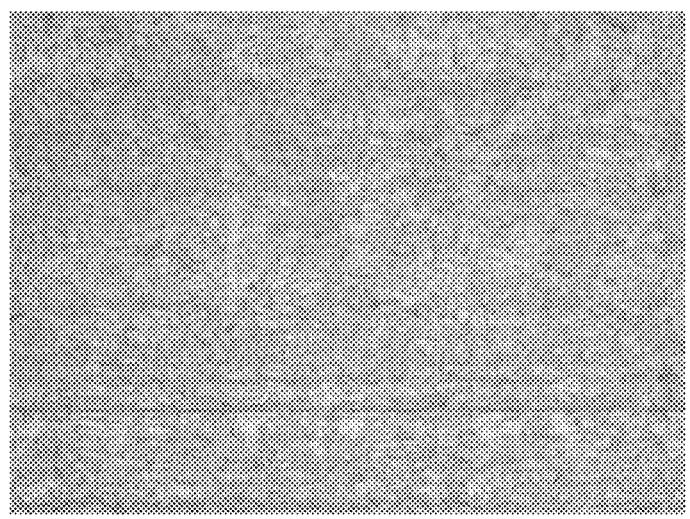
FIG. 3 shows photographs in a field of view of 3 mm×4 mm when an outer peripheral surface of a molded article obtained in Example 1 is observed with a microscope.
Figure 3:

FIG. 3 shows photographs of a field of view of 3 mm×4 mm when the outer peripheral surface of the molded article obtained in Example 1 was observed with a microscope (VHX-2000, manufactured by Keyence Corporation). In FIG. 3(b), a section shown as a black spot (reference sign 7) is a region in which the same component as the inorganic fibers was detected. FIG. 3(a) is a microscope photograph of a region of the outer peripheral surface of the molded article obtained in Example 1 that does not include inorganic fibers, and inorganic fibers are not observed (that is, the area of regions configured from inorganic fibers is less than 1 mm$^2$). FIG. 3(b) is a microscope photograph of a region of the outer peripheral surface of the molded article obtained in Example 1 that is configured from the aluminum-inorganic fiber composited section, and inorganic fibers were observed as black spots with the area thereof calculated by binarization processing as being 0.5 mm$^2$.

Figure 4:
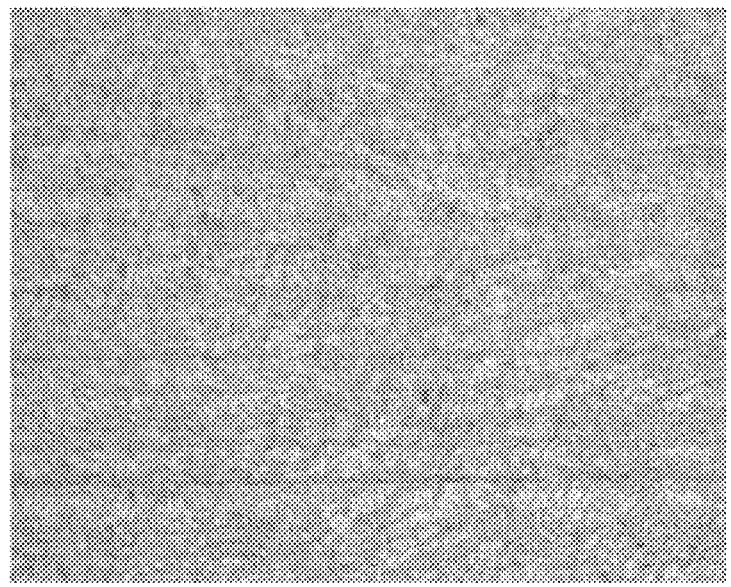
FIG. 4 shows photographs in a field of view of 3 mm×4 mm when an outer peripheral surface of a molded article obtained in Example 2 is observed with a microscope.
Figure 4:
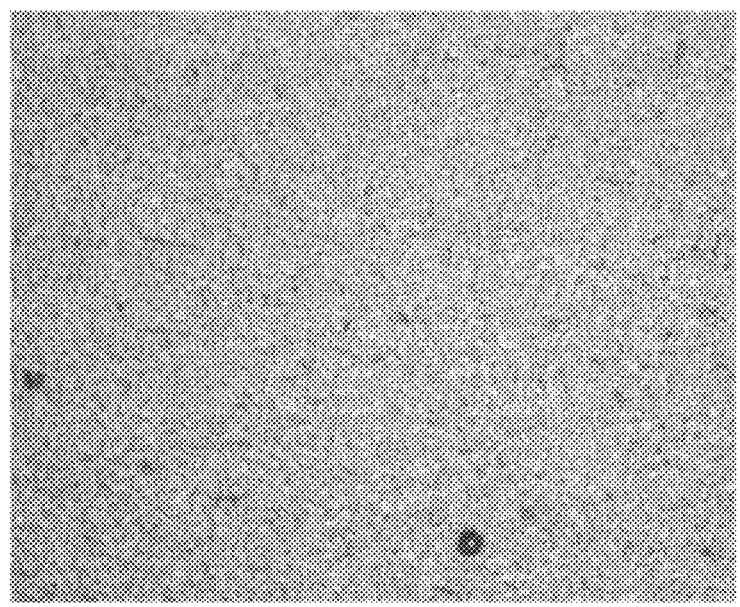

Similarly, FIG. 4 shows photographs of a field of view of 3 mm×4 mm when the outer peripheral surface of the molded article obtained in Example 2 was observed with a microscope. FIG. 4(a) is a microscope photograph of a region of the outer peripheral surface of the molded article obtained in Example 2 that does not include inorganic fibers, and inorganic fibers are not observed. FIG. 4(b) is a microscope photograph of a region of the outer peripheral surface of the molded article obtained in Example 2 that is configured from the aluminum-inorganic fiber composited section, and inorganic fibers are observed as black spots with the area thereof calculated by binarization processing as being 0.04 mm².

(Formation of Plating Layer)

The molded articles obtained in Examples 1 and 2 were subjected to a blast treatment with alumina abrasive grains under conditions of a pressure of 0.4 MPa and a conveying speed of 1.0 m/min and cleaned, and thereafter electroless Ni—P and Ni—B plating was performed. A plating layer having a thickness of 8 μm (Ni—P: 6 μm+Ni—B: 2 μm) was formed on the molded article surfaces. It was possible to form plating layers on the plate surface and outer peripheral surface of all of the molded articles obtained in Examples 1 and 2 with good plating adhesion.

TABLE 1

| | Preheating | | Mold | Density | | | Thermal conductivity | | |
|---|---|---|---|---|---|---|---|---|---|
| | Temperature (° C.) | Holding time (min) | temperature (° C.) | Outer peripheral average (g/cm³) | Center (g/cm³) | Difference (%) | Outer peripheral average (W/mK) | Center (W/mK) | Difference (%) |
| Example 1 | 600 | 120 | 250 | 3.00 | 2.99 | 0.3% | 198 | 199 | 0.5% |
| Example 2 | 650 | 120 | 250 | 3.01 | 3.02 | 0.3% | 206 | 219 | 5.9% |
| Comp Ex 1 | 600 | 40 | 250 | 3.01 | 2.89 | 4.0% | 204 | 165 | 19.1% |
| Comp Ex 2 | 650 | 40 | 250 | 2.99 | 2.85 | 4.7% | 195 | 174 | 10.8% |
| Comp Ex 3 | 600 | 120 | 90 | 3.01 | 2.90 | 3.7% | 214 | 182 | 15.0% |
| Comp Ex 4 | 650 | 120 | 460 | 3.02 | 2.92 | 3.3% | 221 | 181 | 18.1% |

As shown in Table 1, the molded articles of Examples 1 and 2 have a small difference in thermal conductivities between a central section and a section located at an outer peripheral surface side. In contrast thereto, in the molded articles of Comparative Examples 1-4, which have a difference in densities between a central section and a section located on an outer peripheral surface side that exceeds 3%, the difference in thermal conductivities between the central section and the section located on the outer peripheral surface side exceeds 10%, and thus, the difference becomes large.

REFERENCE SIGNS LIST

1 Molded article
2 Through-hole
3, 20 Aluminum-silicon carbide composited section
6, 6' Clipped-out region
4 Metal section
5 Aluminum-inorganic fiber composited section
21 Central section
22a, 22b, 22c, 22d Outer side section

The invention claimed is:

1. A plate-shaped molded article comprising an aluminum-silicon carbide composited section in which a metal comprising aluminum was impregnated into a silicon carbide porous body, wherein:
   a relative density of the silicon carbide porous body in the aluminum-silicon carbide composited section is 60-75%;
   an average thickness of the aluminum-silicon carbide composited section is 2-7 mm, and
   the aluminum-silicon carbide composited section is configured so as to have a planar view quadrangular plate shape and, when the quadrangular plate shape is divided into 25 equally divided pieces by being cut, perpendicularly to the plate surface, along lines that are parallel to one side thereof and that divide the quadrangular plate shape into five equal parts, and along lines that are parallel to a side intersecting the one side and that divide the quadrangular plate shape into five equal parts, a difference between the density, by Archimedes' principle, of a divided piece at the center and an average value of the densities, by Archimedes' principle, of the divided pieces at the four corners is 3% or less.

2. The molded article according to claim 1, further comprising an aluminum-inorganic fiber composited section comprising inorganic fibers and a metal comprising aluminum, wherein:
   the aluminum-inorganic fiber composited section constitutes at least a portion of the outer peripheral surface of the molded article; and
   in a field of view of 3 mm×4 mm when the outer peripheral surface comprising the aluminum-inorganic fiber composited section is observed with a microscope, the area of a region configured from the inorganic fibers is less than 1 mm².

3. The molded article according to claim 2, wherein the aluminum-inorganic composited section has one or more through-holes.

4. The molded article according to claim 1, wherein at least a portion of the plate surface and/or outer peripheral surface has a metal section.

5. The molded article according to claim 1, wherein the molded article is a heat-dissipating component.

6. The molded article according to claim 1, wherein the density, by Archimedes' principle, of the aluminum-silicon carbide composited section is 2.92-3.08 g/cm³.

7. The molded article according to claim 1, wherein a central section and an outer side section of the molded article have a thermal conductivity at 25° C. of 180 W/mK or more.

8. The molded article according to claim 1, wherein a thermal expansion coefficient of the molded article at 150° C. is $9 \times 10^{-6}$/K or less.

9. A method for producing the molded article according to claim 1, wherein the method comprises the following steps:
   (i) preparing a plate-shaped silicon carbide porous body;
   (ii) holding the plate-shaped silicon carbide porous body at 600-750° C. for 50-200 minutes;
   (iii) arranging the silicon carbide porous body obtained in (ii) in a mold heated to 100-450° C.;

(iv) pouring a molten metal containing aluminum into the mold; and (v) impregnating the metal containing aluminum into the plate-shaped silicon carbide porous body.

10. The method according to claim 9, further comprising, in step (i), preparing a plate-shaped silicon carbide porous body having at least one cut-out section in a peripheral edge section thereof, and arranging, in the cut-out section, an inorganic fiber molded article at 70-90 vol % with respect to the volume of the cut-out section, wherein in step (v), the metal containing aluminum is impregnated into the plate-shaped silicon carbide porous body and the inorganic fiber molded article.

* * * * *